(12) United States Patent
Li et al.

(10) Patent No.: US 10,957,668 B2
(45) Date of Patent: Mar. 23, 2021

(54) ANISOTROPIC CONDUCTIVE FILM (ACF) WITH CONTROLLABLE DISTRIBUTION STATE OF CONDUCTIVE SUBSTANCE AND MANUFACTURING METHOD THEREOF

(71) Applicant: Wuhan China Star Optoelectronics Semiconductor Display Technology Co., Ltd., Hubei (CN)

(72) Inventors: Hui Li, Hubei (CN); Zhenyu Zhao, Hubei (CN); Mang Huang, Hubei (CN); Yu Sun, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 357 days.

(21) Appl. No.: 16/083,218

(22) PCT Filed: Jun. 21, 2018

(86) PCT No.: PCT/CN2018/092173
§ 371 (c)(1),
(2) Date: Sep. 7, 2018

(87) PCT Pub. No.: WO2019/218421
PCT Pub. Date: Nov. 21, 2019

(65) Prior Publication Data
US 2020/0312805 A1 Oct. 1, 2020

(30) Foreign Application Priority Data
May 16, 2018 (CN) .......................... 201810467124.9

(51) Int. Cl.
*H01L 23/00* (2006.01)
*C09J 133/04* (2006.01)
*C09J 163/00* (2006.01)

(52) U.S. Cl.
CPC .............. *H01L 24/29* (2013.01); *H01L 24/27* (2013.01); *C09J 133/04* (2013.01); *C09J 163/00* (2013.01);
(Continued)

(58) Field of Classification Search
CPC ................................ H01L 24/29; H01L 24/27
See application file for complete search history.

(56) References Cited

U.S. PATENT DOCUMENTS 6,387,818 B1* 5/2002 Lopatin ............. H01L 21/31144
257/E21.257
2002/0071077 A1 6/2002 Namba
(Continued)

FOREIGN PATENT DOCUMENTS

| CN | 1233350 A | 10/1999 |
|---|---|---|
| CN | 1246932 C | 3/2006 |

(Continued)

*Primary Examiner* — Dale E Page
*Assistant Examiner* — Wilner Jean Baptiste
(74) *Attorney, Agent, or Firm* — Leong C. Lei

(57) ABSTRACT

The present disclosure relates to an anisotropic conductive film (ACF) with controllable distribution state of conductive substance and a manufacturing method thereof. The ACF includes: a porous template, a plurality of conductive tubes, and an insulation glue layer. A plurality of through holes are configured on the porous template and to penetrate the porous template along a thickness direction of the porous template. Each of the conductive tubes is respectively inserted into one through hole and protrudes from the through hole at both ends, and the insulation glue layer is configured to wrap at least one protruding portion of the conductive tube protruding from the porous template. As (Continued)

such, the distribution state of the conductive tube may be controlled by controlling the density of the through holes within the porous template during the preparation process, and the distribution state of the conductive substances in the ACF may be precisely controlled.

5 Claims, 2 Drawing Sheets

(52) U.S. Cl.
CPC .................. *C09J 2203/326* (2013.01); *H01L 2224/27827* (2013.01); *H01L 2224/2919* (2013.01); *H01L 2224/29124* (2013.01); *H01L 2224/29193* (2013.01); *H01L 2224/32225* (2013.01); *H01L 2924/0635* (2013.01); *H01L 2924/0665* (2013.01)

(56) References Cited

U.S. PATENT DOCUMENTS

| | | | |
|---|---|---|---|
| 2005/0233587 A1 | 10/2005 | Baleras et al. | |
| 2006/0113511 A1 | 6/2006 | Chen | |
| 2009/0269549 A1* | 10/2009 | Fujita | H01R 12/714 428/137 |
| 2018/0157164 A1* | 6/2018 | Chen | G03F 1/50 |

FOREIGN PATENT DOCUMENTS

| | | |
|---|---|---|
| CN | 101436440 A | 5/2009 |
| CN | 103050170 A | 4/2013 |
| CN | 103219067 A | 7/2013 |
| CN | 107102489 A | 8/2017 |
| CN | 107342117 A | 11/2017 |
| JP | 0495311 A | 3/1992 |
| JP | 2786316 B2 | 8/1998 |
| JP | 2002124319 | 4/2002 |
| JP | 2002289277 A | 10/2002 |
| JP | 2007095779 A | 4/2007 |
| WO | 9948110 A1 | 9/1999 |

\* cited by examiner

ANISOTROPIC CONDUCTIVE FILM (ACF) WITH CONTROLLABLE DISTRIBUTION STATE OF CONDUCTIVE SUBSTANCE AND MANUFACTURING METHOD THEREOF

RELATED APPLICATIONS

The present application is a National Phase of International Application Number PCT/CN2018/092173, filed Jun. 21, 2018, and claims the priority of China Application No. 201810467124.9, filed May 16, 2018.

FIELD OF THE INVENTION

The present disclosure relates to a conductive material field, and more particularly to an anisotropic conductive film (ACF) with a controllable distribution state and a manufacturing method thereof.

BACKGROUND OF THE INVENTION

Currently, the display performance has been demanded greatly, and the manufacturing techniques of the display screens have been innovated, which indicates the development of material science. In a bonding process of modules, anisotropic conductive film (ACF) must be used. The ACF is a special coating material configured to limit a current to pass the substrate in between two sides of the ACF along the thickness direction of the ACF (Z-axis direction). Conductive particles are configured to electrically connect the electrodes between the integral circuit (IC) chip and the substrate, and the conductive particles may prevent the two adjacent electrodes from being short circuit. As such, the current may only pass through the ACF along the Z-direction.

The conventional ACF includes the plurality of conductive particles and adhesive, and the conductive particles are filled in the resin. The conductive particles are prone to form a local agglomeration in the resin, and the distribution of the conductive particles in the resin are difficult to control. Therefore, the conductive performance may easily be affected, which may result in poor bonding performance. In addition, the structure of the conductive particles of the conventional ACF is complicated, which includes internal polymer, a metal layer (such as Au and Ni) wrapping the polymer, and an insulation layer configured on the outer surface of the insulation layer, which may result in a complicated manufacturing process. Further, the conventional manufacturing process requires a great amount of precious metals, such as Au and Ni, which leads to a high cost.

SUMMARY OF THE INVENTION

The present disclosure relates to an anisotropic conductive film (ACF) with a controllable distribution state and a manufacturing method thereof. As such, the non-uniform distribution and the problem of easily forming the local agglomeration occurred in the conductive particles of the conventional ACFs may be avoided, cost of manufacturing the ACF may be reduced, and conductive performance may be improved.

In one aspect, the present disclosure relates to an anisotropic conductive film (ACF) with a controllable distribution state of conductive substance, including: a porous template, a plurality of conductive tubes, and an insulation glue layer; wherein a plurality of through holes are configured on the porous template and are configured to penetrate the porous template along a thickness direction of the porous template, each of the conductive tubes is respectively inserted into one through hole and protrudes from the through hole at both ends, and the insulation glue layer is configured to wrap at least one protruding portion of the conductive tube protruding from the porous template.

The insulation glue layer covers two opposite sides of the through holes porous template, and the insulation glue layer completely covers the conductive tubes.

The through holes are formed on the porous template in an array, and each of the conductive tubes respectively corresponds to one through hole.

The porous template is made of $SiO_2$ or porous anodized aluminum.

The insulation glue layer is an epoxy resin or an acrylic adhesive.

The conductive tube is carbon nanotube (CNT).

A coverage dimension of the insulation glue layer of the porous template for the two opposite sides is less than a dimension of the porous template, and edges of the two opposite sides of the insulation glue layer are retracted with respect to edges of the porous template.

In another aspect, the present disclosure relates to a manufacturing method of an ACF with a controllable distribution state of conductive substance, including: providing the porous template configured with the plurality through holes; forming a conductive tube array, wherein each of the conductive tubes in the conductive tube array is respectively configured within one through hole of the porous template, and two ends of each of conductive tubes protrude from the through holes; coating an insulation glue layer on two sides of the porous template covering the two ends of the conductive tube.

The conductive tube is methane or acetylene, and is obtained by conducting a chemical vapor deposition (CVD).

In view of the above, the present disclosure adopts the conductive tubes, with superior axial conductivity, low cost, and easy availability, to form the conductive substance in the porous template configured with the plurality of through holes. The distribution state of the conductive tube may be controlled by controlling the density of the through holes within the porous template during the preparation process. As such, the distribution state of the conductive substances in the ACF may be precisely controlled.

DETAILED DESCRIPTION OF PREFERRED EMBODIMENTS

The following descriptions for the respective embodiments are specific embodiments capable of being implemented for illustrations of the present invention with referring to appended figures.

Figure 1:
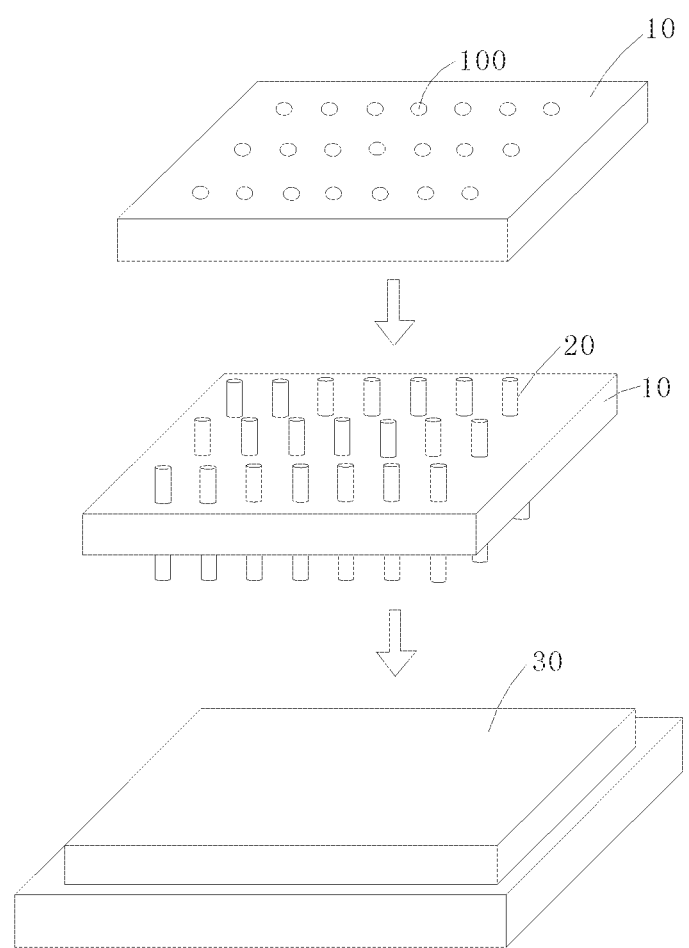
FIG. 1 is a schematic view illustrating a manufacturing process of an anisotropic conductive film (ACF) in accordance with one embodiment of the present disclosure.
Figure 2:
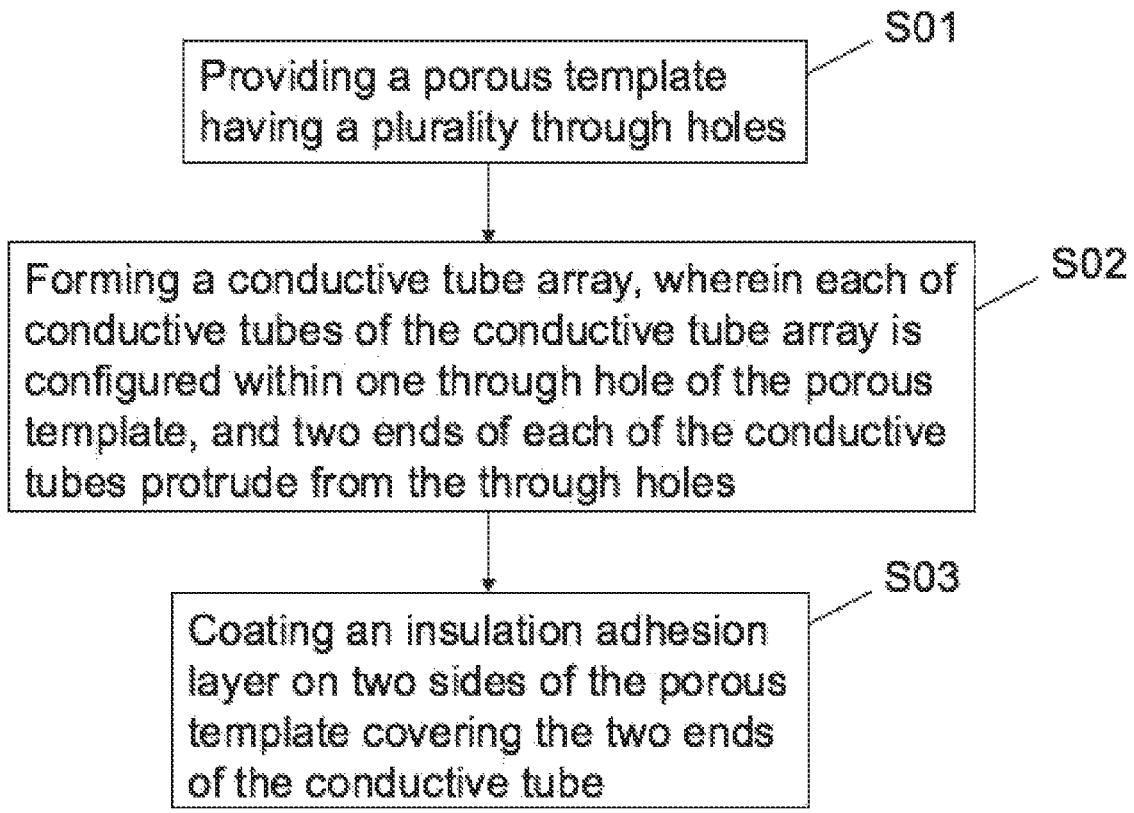
FIG. 2 is a flowchart illustrating a manufacturing method of an ACF in accordance with one embodiment of the present disclosure.

Referring to FIG. 1, the present disclosure relates to a manufacturing method of an anisotropic conductive film (ACF), including the following steps.

In step S01, providing a porous template 10 configured with a plurality through holes 100.

In step S02, forming a conductive tube array, wherein each of conductive tubes 20 in the conductive tube array is configured within one through hole 100 of the porous template 10, and two ends of each of the conductive tubes 20 protrude from the through holes 100.

In step S03, coating an insulation glue layer 30 on two sides of the porous template 10 covering the two ends of the conductive tube 20.

In one example, the conductive tube 20 may adopt carbon nanotube (CNT), which is of a coaxial tubular hollow structure formed by winding a graphite layer at a certain angle along a center. A radial movement of electrons in the CNTs is limited, and the movement of the electrons in an axial direction is not limited. That is, the metallic CNTs have excellent axial conductivity. The CNTs also have extraordinary mechanical properties. An elastic modulus of the CNT is about 1 TPa, which is about 5 times that of steel. An elastic strain of CNT is about 5%, however, the fracture process is not brittle fracture, but has certain plasticity, such that the CNT is capable of withstanding the strain by more than 40%. A CNTs array is formed by the plurality of CNTs having the same length-to-diameter ratio, great orientation, and high purity. As such, the CNT is proper to be adopted as an anisotropic conductive composite material of the present disclosure.

In one example, the porous template 10 may be made of $SiO_2$ or porous anodized aluminum. The porous template 10 may include a limitation structure of the through holes 100 arranged in an array, and the limitation structure is configured to provide a channel limitation during the manufacturing process of the CNT. The conductive tube 20 may be carbon source, such as methane or acetylene, obtained by conducting a chemical vapor deposition (CVD), In one example, the insulation glue layer 30 may be an insulating resin adhesive material suitable for a bonding process, such as an epoxy resin, an acrylic adhesive, or the like.

In step S03, a top and a bottom side of the porous template 10 are coated with the insulation glue layer 30. A thickness of each side of the insulation glue layer 30 is slightly greater than a protruding length of the CNT, and at least one protruding portion of the CNT is buried in the insulation glue layer 30. The through holes 100 are formed on the porous template 10 in an array, and each of the conductive tubes 20 respectively corresponds to one through hole 100. During the manufacturing process, a distribution state of the CNTs array may be controlled by controlling a density of the through holes 100 on the porous template 10, such that a distribution state of the conductive substances in the ACF may be precisely controlled. For example, a pore size and a film thickness of porous anodized aluminum may be controlled by controlling parameters, such as type, concentration, temperature, voltage, and anodization time of reaction liquid, thereby controlling an arrangement of the through holes 100 of the porous template 10.

Figure 3:
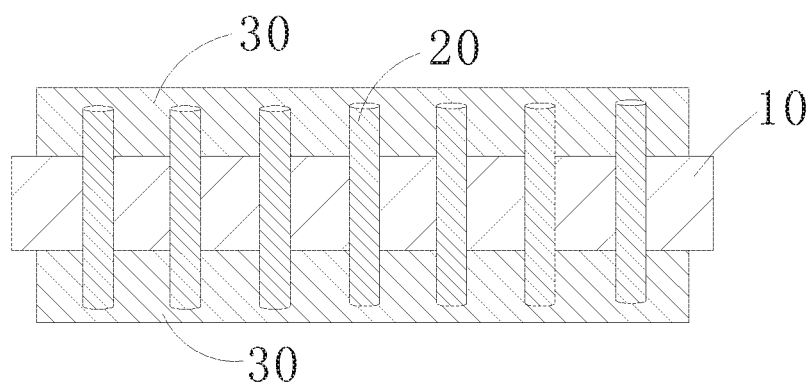
FIG. 3 is a schematic view of an ACF in accordance with one embodiment of the present disclosure.

Referring to FIG. 3, after the manufacturing process is completed, the ACF may include the porous template 10, the plurality of conductive tubes 20, and the insulation glue layer 30. The plurality of the through holes 100 penetrates the porous template 10 along a thickness direction of the porous template 10. Each of the conductive tubes 20 is respectively inserted into one through hole 100 and protrudes from the through hole at both ends. The insulation glue layer 30 is configured to wrap the at least one protruding portion of the conductive tube 20 protruding from the porous template 10. In one example, a surface of the insulation glue layer 30 may not be parallel to the porous template 10. The insulation glue layer 30 may only wrap outer surfaces of each of the conductive tubes 20, however, the present disclosure is not limited thereto. In another example, the insulation glue layer 30 may cover two opposite sides of the porous template 10, which are configured with the through holes 100, and the insulation glue layer 30 may completely cover the conductive tubes 20.

A coverage dimension of the insulation glue layer 30 of the porous template 10 for the two opposite sides is less than a dimension of the porous template 10. Edges of the two opposite sides of the insulation glue layer 30 are retracted with respect to edges of the porous template 10. As such, glue material may be squeezed and spread around under an appropriate pressure to fully bond components, such as chip on film (COF), flexible printed circuits (FPCs), and the like. The CNT penetrates through the surface of the insulation glue layer 30 to electrically connect an upper circuit and a lower circuit. Thus, the ACF may achieve a circuit conduction along the thickness direction of the ACF.

In view of the above, the present disclosure adopts the conductive tubes, with superior axial conductivity, low cost, and easy availability, to form the conductive substance in the through holes porous template. The distribution state of the conductive tube may be controlled by controlling the density of the through holes within the porous template during the preparation process. As such, the distribution state of the conductive substances in the ACF may be precisely controlled Above are embodiments of the present invention, which does not limit the scope of the present invention. Any equivalent amendments within the spirit and principles of the embodiment described above should be covered by the protected scope of the invention.

What is claimed is:

1. An anisotropic conductive film (ACF) with a controllable distribution state of conductive substance, comprising:
   a porous template, a plurality of conductive tubes, and an insulation glue layer;
   wherein a plurality of through holes are configured on the porous template and are configured to penetrate the porous template along a thickness direction of the porous template, each of the conductive tubes is respectively inserted into one through hole and protrudes from the through hole at both ends, and the insulation glue layer is configured to wrap at least one protruding portion of the conductive tube protruding from the porous template;
   wherein the conductive tube is carbon nanotube (CNT); and
   wherein a coverage dimension of the insulation glue layer of the porous template for the two opposite sides is less than a dimension of the porous template, and edges of the two opposite sides of the insulation glue layer are retracted with respect to edges of the porous template.

2. The ACF according to claim 1, wherein the insulation glue layer covers two opposite sides of the porous template, and the insulation glue layer completely covers the conductive tubes.

3. The ACF according to claim 2, wherein the through holes are formed on the porous template in an array, and each of the conductive tubes respectively corresponds to one through hole.

4. The ACF according to claim 1, wherein the porous template is made of $SiO_2$ or porous anodized aluminum.

5. The ACF according to claim 1, wherein the insulation glue layer is an epoxy resin or an acrylic adhesive.

* * * * *